United States Patent
Tassan Caser et al.

[11] Patent Number: 5,822,247
[45] Date of Patent: Oct. 13, 1998

[54] DEVICE FOR GENERATING AND REGULATING A GATE VOLTAGE IN A NON-VOLATILE MEMORY

[75] Inventors: Fabio Tassan Caser, Milan; Corrado Villa, Sovico; Simone Bartoli, Pisa, all of Italy

[73] Assignee: SGS-Thomson Microelectronics, S.r.l., Agrate Brianza, Italy

[21] Appl. No.: 775,111

[22] Filed: Dec. 30, 1996

[30] Foreign Application Priority Data

Dec. 29, 1995 [EP] European Pat. Off. .............. 95830553
Jun. 20, 1996 [EP] European Pat. Off. .............. 96830352

[51] Int. Cl.$^6$ ................................................. G11C 16/04
[52] U.S. Cl. ................ 365/185.18; 365/189.09; 365/185.28; 365/185.29
[58] Field of Search .......... 365/185.18, 185.28, 365/185.29, 189.11, 226, 189.09; 327/538, 543

[56] References Cited

U.S. PATENT DOCUMENTS

| | | | |
|---|---|---|---|
| 5,291,446 | 3/1994 | Van Buskirk et al. | 365/189.09 |
| 5,444,412 | 8/1995 | Kowalski | 327/541 |
| 5,463,586 | 10/1995 | Chao et al. | 365/210 |
| 5,511,026 | 4/1996 | Cleveland et al. | 365/189.09 |
| 5,642,309 | 6/1997 | Kim et al. | 365/185.22 |

*Primary Examiner*—Son Mai
*Attorney, Agent, or Firm*—David V. Carlson; Seed and Berry LLP

[57] ABSTRACT

The present invention relates to a device for generating and regulating a gate voltage in an electrically programmable non-volatile memory with single power supply of the type comprising a voltage booster driven by a clock signal applied to a first input terminal thereof and having an output terminal on which is produced a signal with higher voltage. This device comprises a lower regulator block and a programming switching block inserted in parallel each other between said output terminal of the voltage booster and an output terminal of the gate voltage generating and regulating device with said lower regulator block being driven by a plurality of switching signals to supply on the output terminal of the device a plurality of regulated voltages and feed the control gates of the non-volatile memory cells.

9 Claims, 11 Drawing Sheets

DEVICE FOR GENERATING AND REGULATING A GATE VOLTAGE IN A NON-VOLATILE MEMORY

FIELD OF APPLICATION

The present invention relates to a device for generating and regulating a gate voltage in an electrically programmable non-volatile memory with single power supply.

BACKGROUND OF THE INVENTION

As known, a semiconductor non-volatile memory structure comprises a matrix of memory cells each provided by a MOS transistor in which the gate electrode is located above the channel region and is completely isolated by means of a dielectric and is thus floating. The cell also comprises further source and drain terminals.

By applying appropriate voltages to the cell terminals it is possible to change the amount of charge present in the floating gate, e.g. by utilizing the known Fowler-Nordheim Tunneling and/or Channel Hot Electrons Injection phenomena. This allows forcing two logical states for the transistor, i.e. a first state with "high" threshold voltage or a second one with "low" threshold voltage.

Since the floating gate shows high impedance to any other terminal of the cell, the charge stored therein can persist for an indefinite period of time even when the power supply is removed from the circuit in which it is inserted. The cell thus has non-volatile memory characteristics.

The operations which modify the content of the memory cells are in particular the programming and erase phases by means of which the charge in the floating gate is stored or removed.

The present invention relates to the provision of a device for generating and regulating a positive voltage Vg to be applied to the transistors gates during operations of change of the content of the memory cells.

Specifically reference is made below to a non-volatile memory of the Flash type with single supply voltage Vcc of, for example, 5V.

In general, to the memory circuits are supplied from outside two voltages and specifically a 5V supply voltage Vcc and a 12V programming voltage Vpp. Regulation of the gate voltage Vg is normally obtained by a division of the programming voltage Vpp.

In this manner is achieved a relatively stable gate voltage Vg with respect to the temperature and the circuit production process parameters even though it is variable within ±5% with the programming voltage Vpp.

The current tendency of the technology of memories integrated on a semiconductor thrusts towards devices powered from the outside with a single supply voltage. This complicates the architecture of the device which must generate within itself the programming and erase voltages which are outside the normal power supply range of 0V to 5V.

The voltage change operations are generally managed inside the memory device by means of appropriate programming, verification and erase circuits and methods which are implemented by appropriate algorithms.

In particular, FIG. 1 shows by means of a block diagram an algorithm 1 which concerns the operations necessary in the 'programming' phase.

Programming of the cells refers to programming bytes. The algorithm 1 comprises an operation loop 2 and specifically:

- a verification phase 3 of complete programming of the byte in question. During this verification phase 3 the gate voltage Vg must hold a steady value of 7V for the duration of 2 $\mu s$;
- a real programming phase 4 of the byte in question. The programming takes place in a pulsed manner and is activated only when the previous verification phase 3 has given a negative result, i.e. when the byte in question is not programmed. The gate voltage Vg in this phase must show a rising slope lasting approximately 1 $\mu s$ taking its value from 7V to 12V, and hold this 12V value for an interval of approximately 3 $\mu s$ and return to 7V with a second falling slope for a total time interval of 5 $\mu s$ approximately. The use of such a pattern for the gate voltage Vg allows in particular minimizing the maximum current input of the cells.

When the verification phase 3 gives a positive result the loop 2 terminates and therewith the programming phase. The algorithm 1 comprises a final phase 6 of return to steady conditions, e.g. to a reading mode.

It is also possible to exit from loop 2 after a finite number of cycles with negative results.

FIG. 2 shows through a block diagram an algorithm 7 relating the sequence of operations for the erase phase.

Erase of the cells can involve the entire memory chip or a small number of sectors in which it is splitted. From the point of view of generation of the gate voltage Vg these two conditions are equivalent and can be shown by means of the algorithm 7 which comprises a first 8 and a second 9 operation loop.

Specifically the first loop 8 comprises steps 10 and 11.

A real erase phase 10 of the selected sectors or the entire chip can occur. The erasing takes place in a pulsed manner and uses a negative gate voltage Vg.

A verification phase 11 of completed erase of each single byte of the sector or chip in question then occurs. The verification phase 11 is always performed on eight bits in parallel. If even a single bit is not erased, the verification phase gives a negative result and the loop 8 starts over giving a new erase pulse. During this phase there is applied to each byte a gate voltage Vg of 4V for an interval of 100 ns.

When the verification phase 11 gives a positive result the loop 8 ends and therewith the erase phase. It is possible, as in the case of the programming phase, for the loop 8 to exit from after a finite number of cycles giving a negative result.

The algorithm 7 comprises another operations loop 9 comprising the following phases of steps 12 and 13.

A verification phase 12 determines whether a byte was depleted during the former erase phase, i.e. shows a negative threshold voltage. This verification relates to byte and it applies a 4V gate voltage for 2 $\mu s$.

A soft programming phase 13 of each depleted byte is the second phase of the operations loop 9. The soft programming takes place in a pulsed manner and is activated only when the former verification phase 12 has given a negative result, i.e. when the byte in question is depleted. There is applied a gate voltage Vg less that the gate voltage used during the normal programming phase but with similar pattern. Initially there is used a voltage of 4.5V which is increased by 0.5V up to 6V if the verification phase continues to give a negative result. Then a voltage of 7V is used and even if the verification phase 12 continues to give a negative result the loop 9 is abandoned. Each soft programming pulse is applied for an interval of 5 $\mu s$.

When the verification phase 12 gives a positive result or after a predetermined number of negative results the loop 9 terminates and therewith the erase phase. The algorithm 7 comprises, as for the algorithm 1, a final phase 6' of return to steady conditions, i.e. to a reading mode.

The known flash memory matrices use multiple devices for generating and regulating the gate voltage Vg to be applied to the word lines WL in the different operating conditions of the memory matrix.

The evident disadvantages of this solution are complexity of and space occupied in terms of integration surface area by the device for generating and regulating the gate voltage to be applied to the word lines of the memory which translates into an increase in integration and production costs thereof.

In addition the presence of a high number of voltage generators and regulators produces high current input with resulting increase in the power dissipation of the memory device as a whole.

SUMMARY OF THE INVENTION

According to principles of the present invention, a gate voltage generating and regulating device having structural and functional characteristics such as to allow supplying the different voltage values necessary for optimal change of the content of the memory cells while achieving economies in terms of current input and hence of dissipated power is proposed to thereby overcome the limits of the current solutions proposed by the prior art.

The solution underlying the present invention is to select, through appropriate enable signals, the correct gate voltage within a range of voltage signals generated starting from a constant voltage HV specifically equal to the programming voltage.

A gate voltage generating and regulating device of the type indicated above and defined in the characterizing part of the annexed claims is described herein.

Specifically the gate voltage generating and regulating device in accordance with the present invention comprises a first upper regulator block which holds constant the value of voltage HV and a second lower regulator block which acts on the gain of an operational amplifier to obtain a plurality of voltage values.

Control of these upper and lower regulators is achieved by using a plurality of switching signals correlated with the different operating conditions of the memory device.

The technical problem is also solved by means of an enable signal timing method capable of achieving correct switching between the gate voltage values in each phase of change of the content of a memory cell.

The characteristics and advantages of the gate voltage generating and regulating device in accordance with the present invention are set forth in the description of an embodiment thereof given below by way of non-limiting example with reference to the annexed drawings.

DETAILED DESCRIPTION

Figure 1:
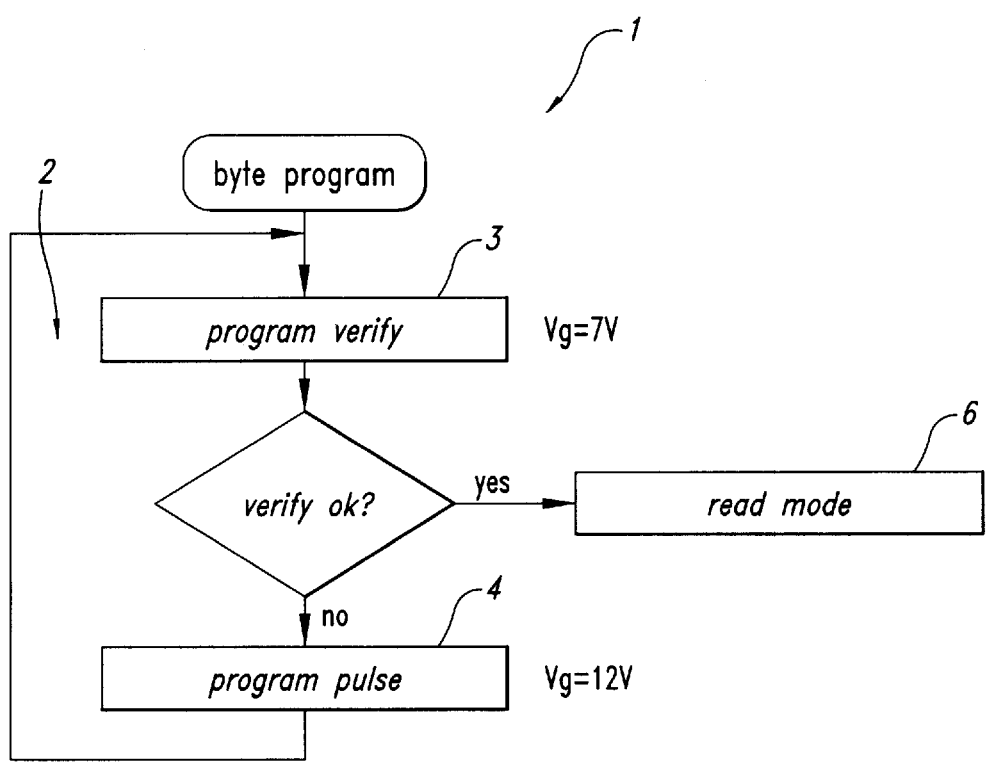
FIG. 1 shows a flow chart of an algorithm for a memory word programming phase in accordance with the present invention.
Figure 2:
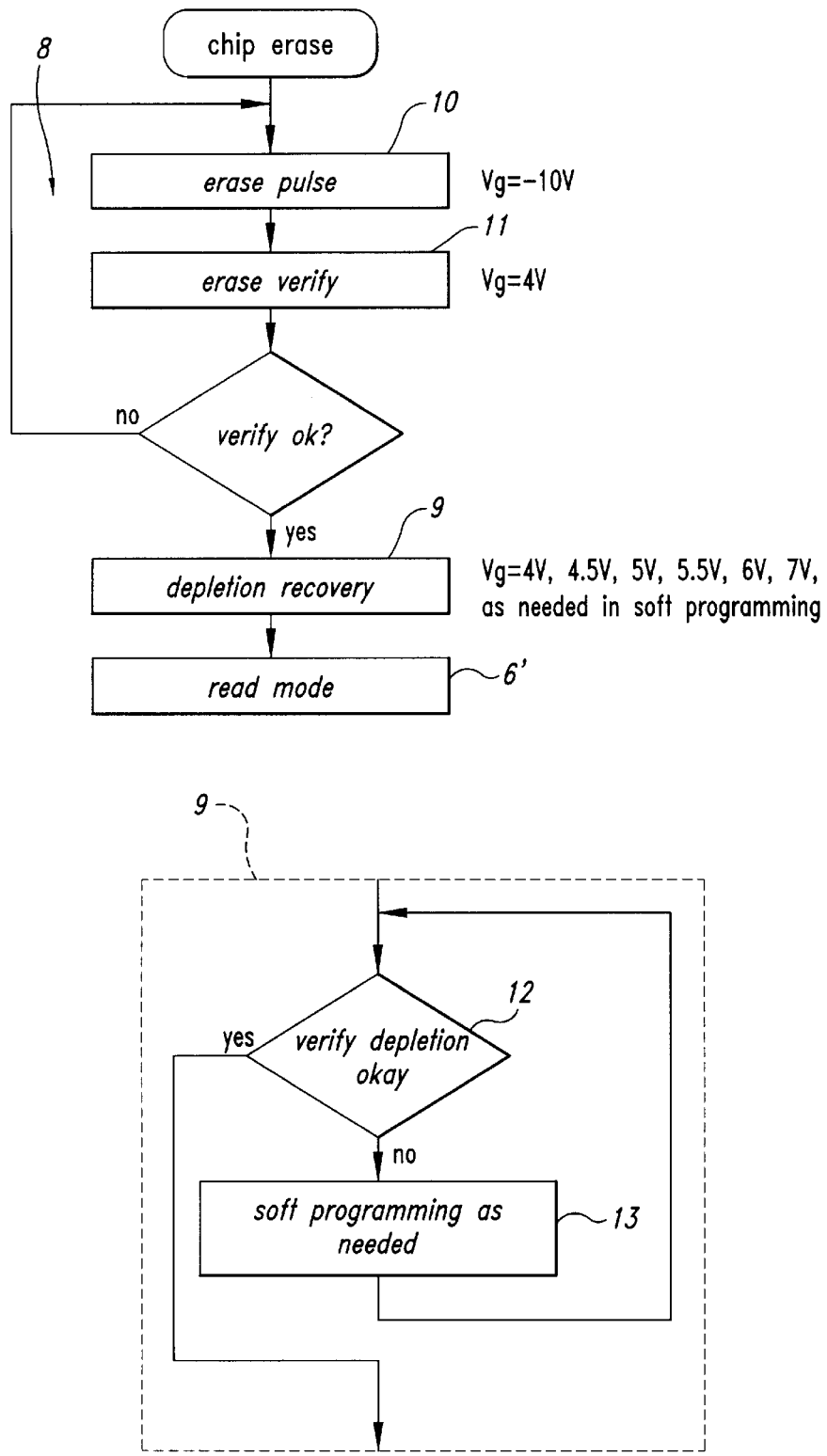
FIG. 2 shows a flow diagram of an algorithm for a memory word erase phase in accordance with the present invention.
Figure 3:
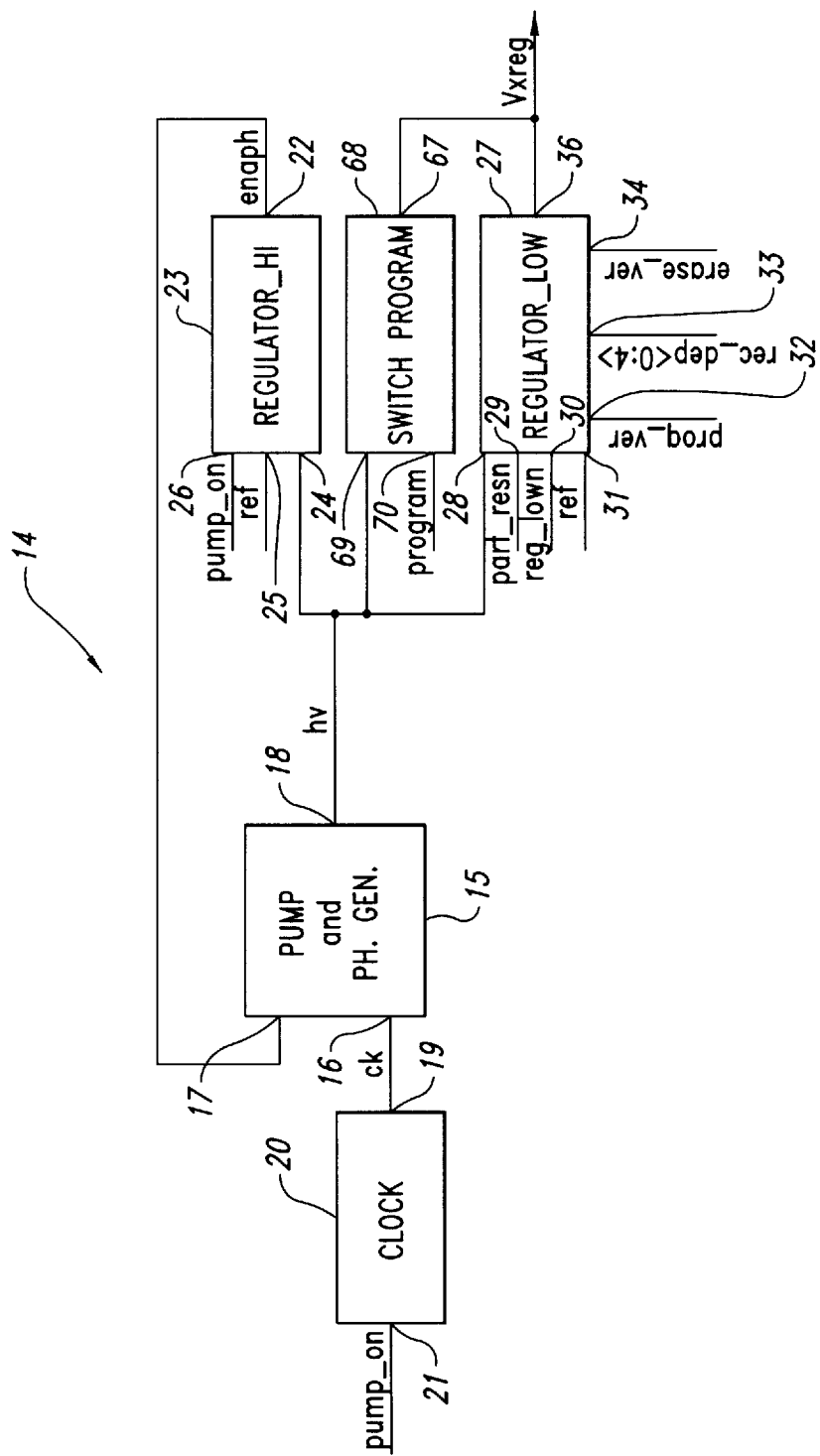
FIG. 3 shows schematically a memory cell gate voltage generating and regulating device in accordance with the present invention.

With reference to the above figures, reference number 14 indicates as a whole and schematically a gate voltage generating and regulating device provided in accordance with the present invention for cells of an electrically programmable and erasable non-volatile memory MEM.

The device 14 comprises a generator block 15 for a voltage HV relatively high and boosted with respect to the supply voltage. The block 15 has a first input terminal 16 and a second input terminal 17 as well as an output terminal 18 on which is produced a higher voltage signal HV.

The first input terminal 16 of the generator block 15 is connected to an output terminal 19 of a clock 20 which generates a clock signal CK.

The clock 20 has an input terminal 21 which receives an enable signal PUMP_ON.

In a preferred embodiment of the present invention the generator block 15 comprises a charge pump circuit driven by four phase signals appropriately disoverlapped and generated by a phase generator on the basis of the clock signal CK.

The second input terminal 17 of the generator block 15 is connected to an output terminal 22 of a first upper regulator block 23 having a first input terminal 24 connected to the output terminal 18 of the generator block 15.

The first upper regulator block 23 receives on a second 25 and a third 26 input terminal a voltage reference signal REF and the enable signal PUMP_ON.

The upper regulator block 23 supplies at output a regulation signal ENAPH for the generator block 15.

In a preferred embodiment of the present invention the regulation signal ENAPH is applied to the phase generator incorporated in the generator block 15.

The device 14 for generating and regulating the gate voltage further comprises a lower regulator block 27 having a first input terminal 28 connected to the output terminal 18 of the generator block 15 as well as a second 29, third 30 and fourth 31 input terminals receiving respectively a second PART_RESN and a third REG_LOWN enable signal and the voltage reference signal REF.

The lower regulator block 27 has a switching terminal 32 receiving a PROG_VER signal; a second switching terminal 33 receiving a SOFTP and DEPL_VER signal, collectively shown as REC_DEP<0:4>; and a third switching terminal 34 receiving an ERASE_VER switching signal. The regulator block 27 also contains an output terminal 36 connected to an output terminal 67 of a programming switching block 68 (shown in FIG. 5) having in turn a first input terminal 69 connected to the output terminal 18 of the generator block 15, and a second input terminal 70 which receives a fourth enable signal PROGRAM.

The output terminal 36 of the lower regulator block 27 is the output terminal OUT of the gate voltage generating and regulating device 14 and supplies a regulated voltage Vxreg for controlling the gate terminals of the memory cells of the addressed row WL. The regulated voltage Vxreg takes on different values in the different operating conditions of the memory device MEM.

In a preferred embodiment of the present invention, with a maximum threshold voltage Vs equal to the programming voltage of the memory cells, e.g. 12V, the values of the regulated voltage Vxreg can be as follows.

TABLE I

| OPERATING CONDITION | Vxreg |
| --- | --- |
| programming | Vs = 12 V |
| soft-programming | Vsp<0> = 4.5 V |
|  | Vsp<1> = 5 V |
|  | Vsp<2> = 5.5 V |
|  | Vsp<3> = 6 V |
|  | Vsp<4> = 7 V |
| programming verification | Vpv = 7 V |
| erasing verification | Vev = 4 V |
| depleted bit condition verification | Vdv = 4 V |

There are now discussed in detail the blocks incorporated in the gate voltage generating and regulating device 14 in accordance with the present invention.

Figure 4:
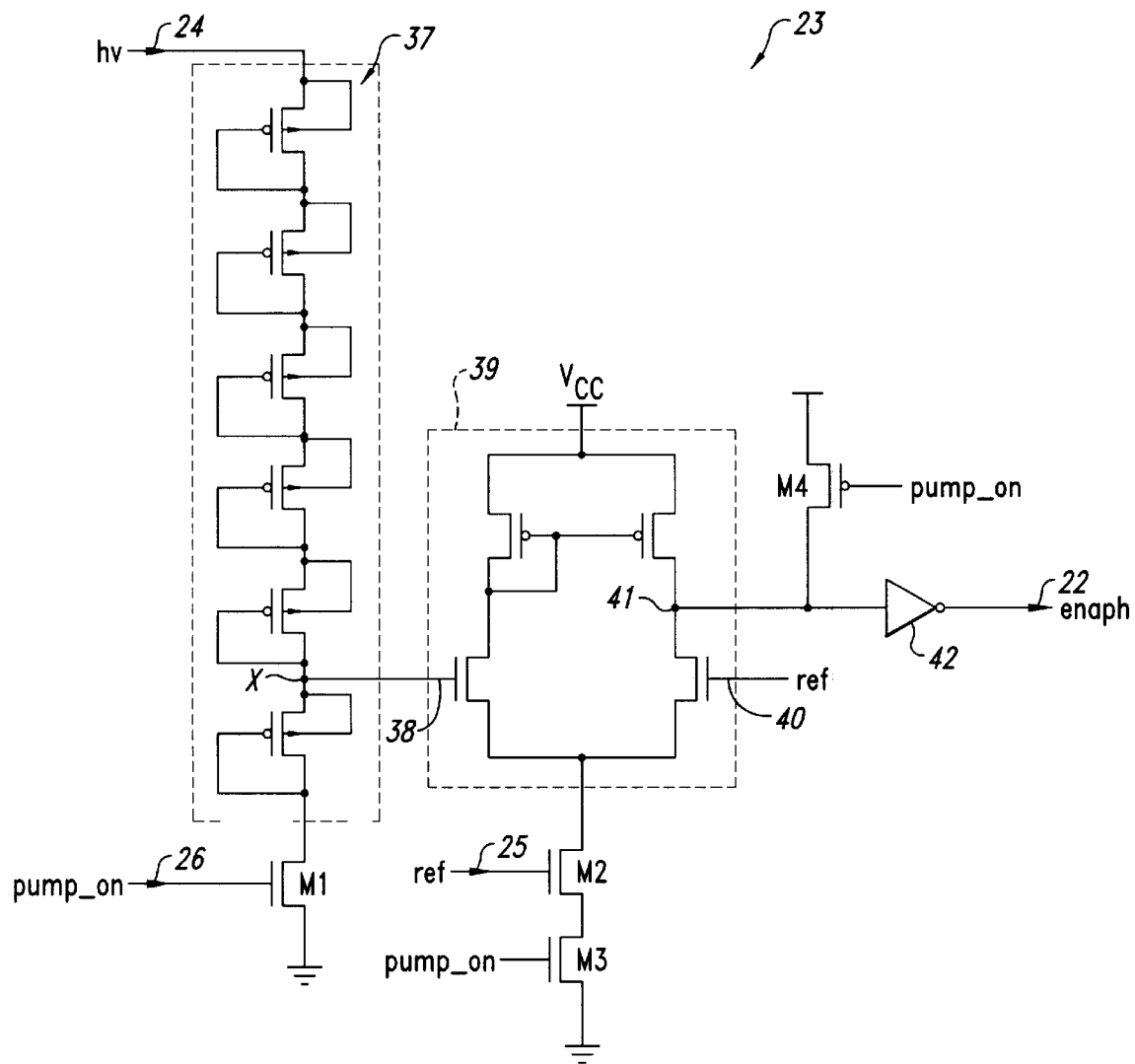
FIG. 4 shows an upper regulator block incorporated in the device in accordance with the present invention.

FIG. 4 shows the upper regulator block 23 which is activated by the enable signal PUMP_ON each time the charge pump of the generator block 15 is operating. The function of the block 23 is to limit the higher voltage HV generated on the output terminal 18 of said generator block 15 below a threshold voltage value Vs and in particular equal to the programming voltage of the memory cells.

The upper regulator block 23 comprises a voltage divider 37 connected to the first input terminal 24 of the block and a first voltage reference, in particular a ground GND through a first enable transistor M1.

Advantageously in accordance with the present invention the voltage divider 37 can be provided by means of a divider of P-channel MOS transistors in diode configuration, i.e. having their gate and drain terminals connected together.

The use of a transistor for the divider allows limiting current consumption and occupation of silicon surface area for its integration. Specifically, the present invention concerns a device of the type comprising a booster driven by a clock signal applied to a first input terminal thereof and having an output terminal on which is produced a voltage signal higher than the supply voltage. Other devices could be used to form the divider 37, such as resistors, standard diodes, standard MOS devices of a selected size, etc.

In the embodiment of FIG. 4 the voltage divider 37 comprises six P-channel MOS transistors having their body terminal connected to their source terminal in such a manner as to bias the well in which these transistors are provided at the source voltage to eliminate the so-called 'body effect'.

The voltage divider 37 thus performs a division by six, i.e. by the number of transistors of which it is made up, of the voltage HV generated on the output terminal 18 of the generator block 15.

The first enable transistor M1 is an N-channel MOS transistor having the gate terminal connected to the third input terminal 26 of the upper regulator block 23 on which is applied the enable signal PUMP_ON.

The voltage divider 37 is connected, corresponding to a circuit node X on which is generated a reduced voltage value Vpar, to an input 38 of a comparator 39. The comparator 39 is connected to a supply voltage reference Vcc and a ground GND through the series of a second M2 and a third M3 enable transistor.

The control gate terminal of the second enable transistor M2 is the second input terminal 25 of the upper regulator block 23 and receives the voltage reference signal REF while the control gate terminal of the third enable transistor M3 receives the enable signal PUMP-ON.

The comparator 39 has a second input terminal 40 which receives the voltage reference signal REF as well as an output terminal 41 connected to the output terminal 22 of the upper regulator block 23 through an inverting buffer 42.

The output terminal 41 of the comparator 39 is also connected to the supply voltage reference Vcc through a further P-channel MOS enable transistor M4 which receives on the control gate terminal the enable signal PUMP-ON.

The comparator 39 can be provided in a known manner. One acceptable circuit is use of a first and a second P-channel MOS transistors having their drain terminals connected respectively to the drain terminals of a first and a second N-channel MOS transistors. The P-channel MOS transistors have their source terminals joined together and to supply voltage reference Vcc while the N-channel MOS transistors have their source terminals joined together and to ground GND through the enable transistors M2 and M3.

In particular, the second P-channel MOS transistor is in diode configuration.

The gate terminals of the N-channel MOS transistors are the input terminals 38 and 40 of the comparator 39 while the joined drain terminals of the first P-channel transistor and of the first N-channel transistor are the output terminal 41 thereof.

It is accordingly evident that the comparator 39 performs a comparison between the reduced voltage value Vpar obtained from the voltage divider 37 starting from the higher voltage signal HV generated at the output 18 of the generator block 15 and the voltage reference signal REF.

The outcome of the comparison is the regulation signal ENAPH generated on the output terminal 22 of the upper regulator block 23 and which stops operation of the generator block 15 when the value of the higher voltage HV outputted by this block 15 exceeds the threshold voltage value Vs.

In particular, the regulation signal ENAPH stops the phase generator incorporated in the generator block 15 in such a manner that the higher voltage HV decreases.

Figure 5:
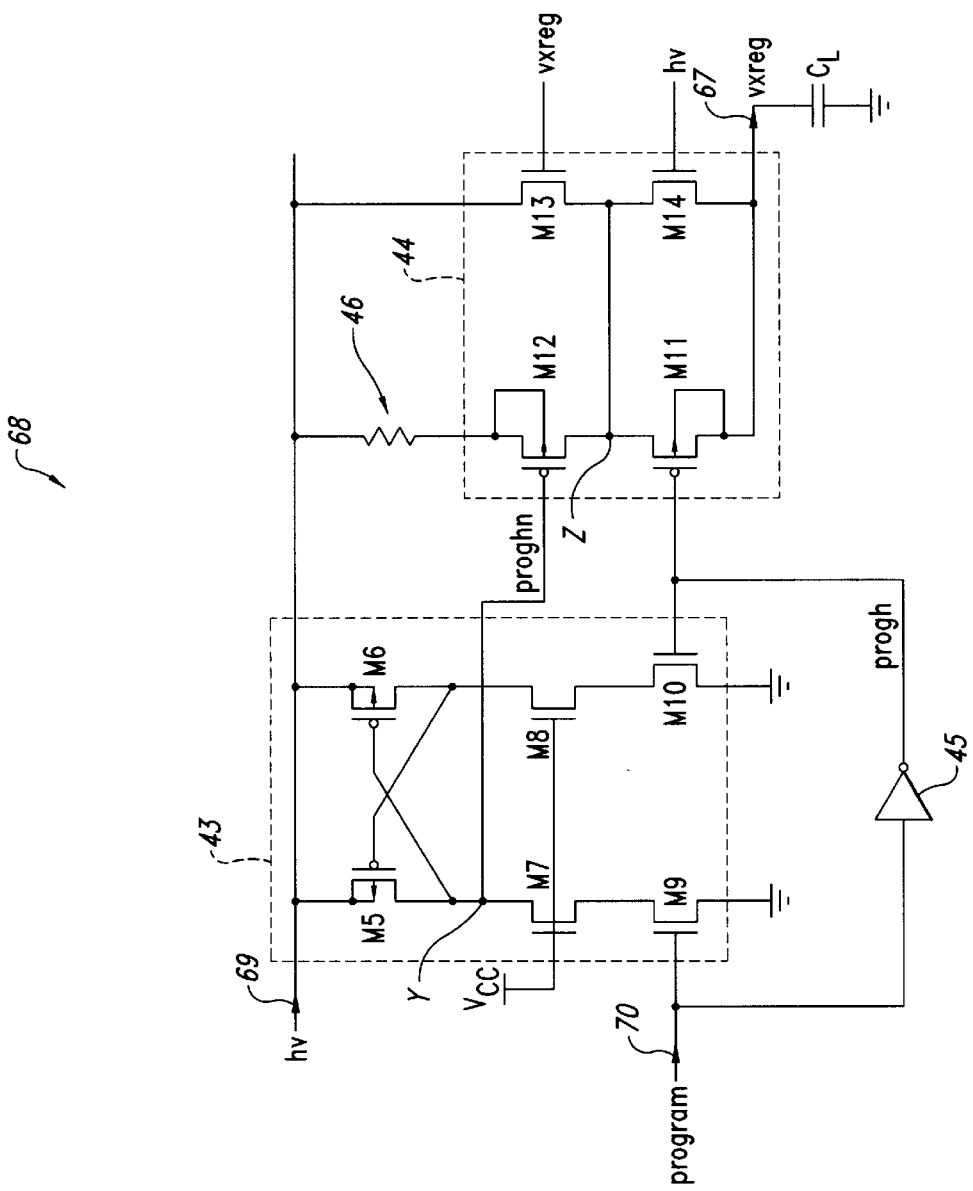
FIG. 5 shows a switching block incorporated in the device in accordance with the present invention.

FIG. 5 shows the programming switching block 68 which is activated by means of the fourth enable signal PROGRAM during the real programming phase 4.

Figure 6:
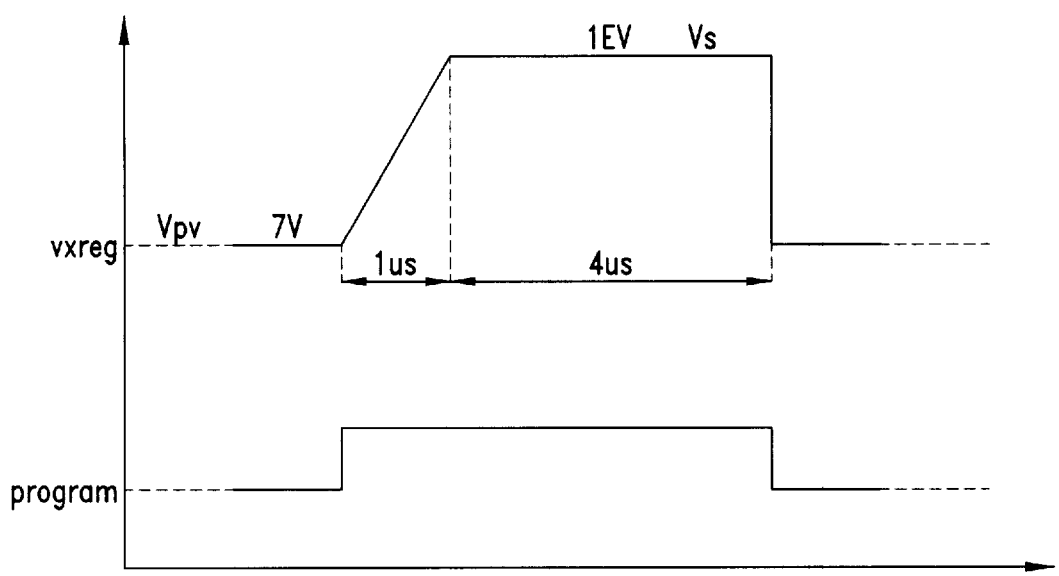
FIG. 6 shows respective patterns of the voltage supplied by the device in accordance with the present invention.

The pattern of the regulated voltage Vxreg necessary to this operating phase is shown in FIG. 6 beside the pattern of the fourth enable signal PROGRAM. The regulated voltage Vxreg is taken from a programming verification voltage Vpv of 7V in accordance with Table I to the programming voltage Vs of 12V with a slope lasting 1 $\mu$s and is held at this value Vs for a period of 4 $\mu$s. The total time of the programming pulse is thus 5 $\mu$s.

The programming switching block 68 comprises a high voltage switch 43 and an enable circuit 44 in series each other and inserted between the first input terminal 69 and the output terminal 67 of the block 68.

The high voltage switch 43 comprises a first M5, second M6, third M7, fourth M8, fifth M9 and sixth M10 high voltage MOS transistor. In the embodiment of FIG. 5 the first M5 and second M6 transistors are P-channel while the remaining transistors M7, M8, M9 and M10 are N-channel.

The transistors M5 and M6 have their source terminals connected together and to the first input terminal 69 as well as to the respective body terminals. In addition, the control gate terminal of the transistor M5 is connected to the drain terminal of the transistor M6 and vice versa.

The drain terminals of the transistors M5 and M6 are also connected to the ground GND through the series of transistors M7 and M9, and the transistors M8 and M10 respectively. The transistors M7 and M8 have in turn their control gate terminals connected together and to the supply voltage reference Vcc while the transistors M9 and M10 have their gate terminals connected together through a logical inverter 45.

The drain terminals of the transistors M5 and M7 define a circuit node Y inside the high voltage switch 43 on which is generated an enable signal PROGHN with pattern similar to a negated enable signal PROGN which is in turn supplied at the output of the logical inverter 45 but with a voltage level corresponding to the value of the higher voltage HV.

The gate terminal of the transistor M9 is also connected to the second input terminal 70 of the block 68 while the gate terminal of the transistor M10 is also connected to the gate terminal of a first MOS transistor M11 incorporated in the enable circuit 44.

The enable circuit 44 also comprises a second M12, third M13 and fourth M14 MOS transistor. In the example of FIG. 5 the transistors M11 and M12 are P-channel while the transistors M13 and M14 are N-channel.

In particular the transistors M11 and M12 are inserted in series each other between the first input terminal 69 by means of a slope resistance 46 and the output terminal 67 of the programming switching block 68. In addition, the transistors M11 and M12 have their body terminals connected respectively to the drain and source terminals and the transistor M12 has its control gate terminal connected to the circuit node Y.

Similarly, the transistors M13 and M14 are inserted in series each other between the first input terminal 69 and the output terminal 67 of the programming switching block 68. They receive on their control gate terminals respectively the high voltage HV and the regulated voltage Vxreg signals.

In addition, the source and drain terminals of the transistors M11, M13 and M12, M14 respectively are connected together and define another circuit node Z inside the enable circuit 44.

In FIG. 5 the circuitry outside the programming switching block 68 is represented schematically by a charge capacitor CL inserted between the output terminal 67 on which is generated the regulated voltage signal Vxreg and ground GND.

The enable signal PROGHN allows the transistor M12 of the enable circuit 44 to go off under all operating conditions in which HV>Vcc, i.e. outside the real programming phase.

In the real programming phase the transistor M12 and consequently the transistor M11 is active and the higher voltage HV is equal to Vpv=7V (reached at the end of the former programming verification phase).

The slope of FIG. 6 which raises the regulated voltage Vxreg to the value of HV is obtained thanks to the interaction between the slope resistance 46 and the charge capacitor $C_L$ present on the output terminal 67. A reasonable value for this charge capacitor $C_L$ is 80 pF.

The transistors M11 and M12 have their well regions biased respectively at the high voltage HV and the regulated voltage Vxreg values. If these voltage values differ by a value DIFF equal at least to the threshold voltage Vth__nch of an N-channel MOS transistor, the transistors M13 and M14 held the voltage present on the circuit node Z biased at the lesser of the voltage values HV and Vxreg while the transistors M11 and M12 are off.

Figure 7:
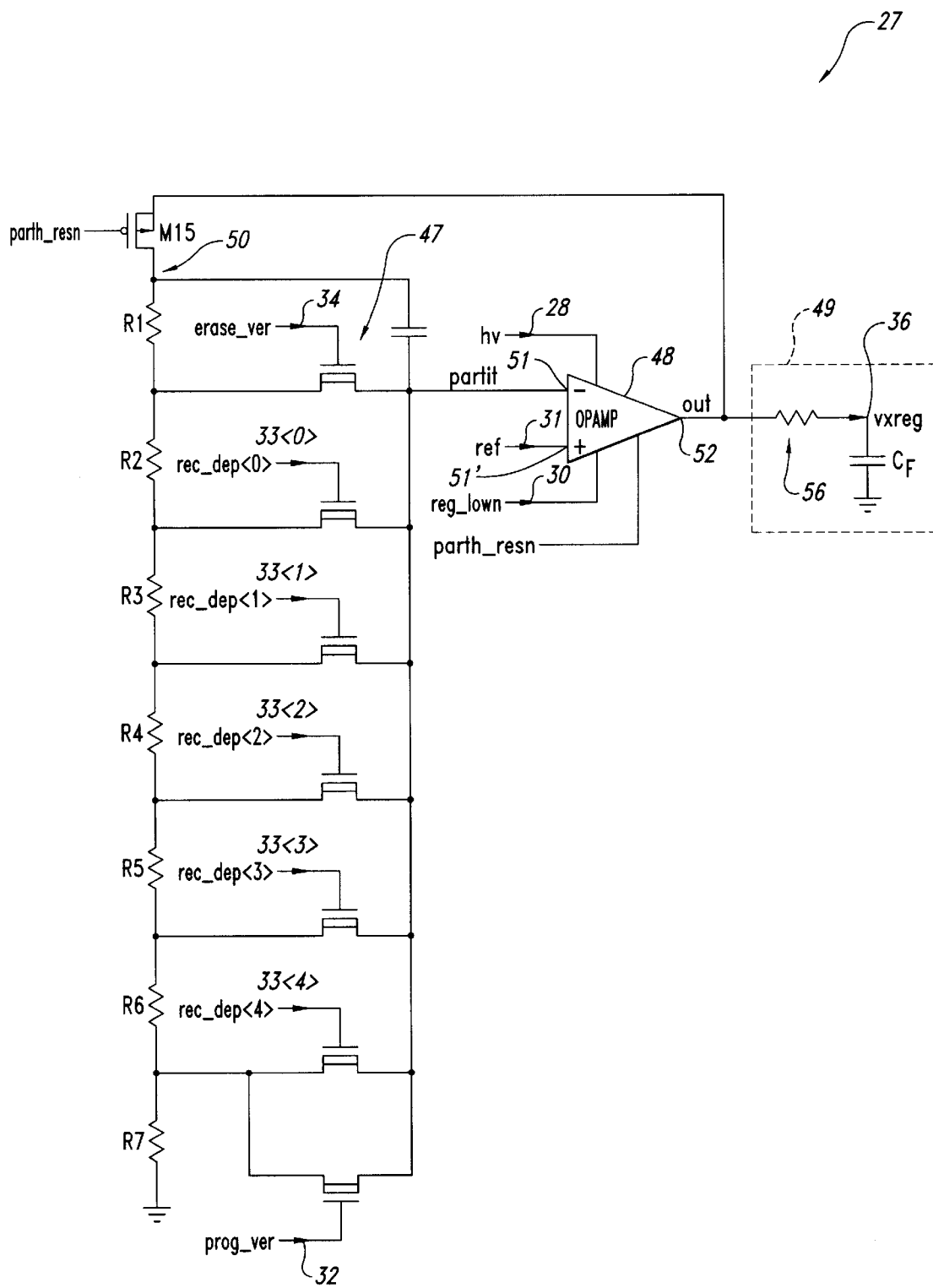
FIG. 7 shows another lower regulator block incorporated in the device in accordance with the present invention.

The gate voltage generating and regulating device 14 comprises furthermore another lower regulator block 27 shown in FIG. 7.

The lower regulator block 27 comprises a multiplexer 47 connected to the output terminal 36 by means of the series of an operational amplifier 48 in noninverting configuration and a filter 49.

The multiplexer 47 of FIG. 7 has switching terminals 32–34 which receive respective switching signals PROG__VER, SOFTP, DEPL__VER and ERASE__VER. The signals SOFTP and DEPL__VER as shown collectively as REC__DEP. In particular, the switching terminal 33 is a multiple switching terminal and receives a plurality of switching signals SOFTP<0>, SOFTP<2>, SOFTP<3> e SOFTP<4>. These signals are combined with the DEPL__VER signal and shown in FIG. 7 as REC_DEP<0>, REC_DEP<1>, REC_DEP<2>, REC_DEP<3>, and REC_DEP<4>.

The multiplexer 47 also comprises a plurality of MOS transistors inserted in parallel each other between the ground voltage reference GND through a resistive divider 50 and an inverting input terminal 51 of the operational amplifier 48. The control gate terminals of these transistors define the switching terminals 32–34.

The operational amplifier 48 has in turn a first, second and third enable terminals connected to the first 28, third 30 and fourth 31 input terminals of the lower regulator block 27. The input terminals 31, 30 and 28 receive respectively the voltage reference signal REF, the third enable signal REG__LOWN as well as the higher voltage signal HV.

The multiplexer 47 of FIG. 7 comprises in particular eight N-channel MOS transistors having their drain terminals in common or connected together and to the inverting input terminal 51 of the operational amplifier 48 and their source terminals connected to the resistive divider 50. The latter comprises seven resistive elements R1, R2, R3, R4, R5, R6 and R7 inserted in series each other between the ground voltage reference GND and an output terminal 52 of the operational amplifier 48 by means of an enable terminal M15 of the high voltage MOS type.

In particular the transistor M15 has its body terminal connected to the source terminal and to the output terminal 52 of the operational amplifier 48 and receives on the control gate terminal a raised activation signal PARTH__RESN. The drain terminal of the transistor M15 is connected to the resistive divider 51 and to the inverting input terminal 51 of the operational amplifier 48 by means of a compensating capacitor Cp.

Figure 7A:
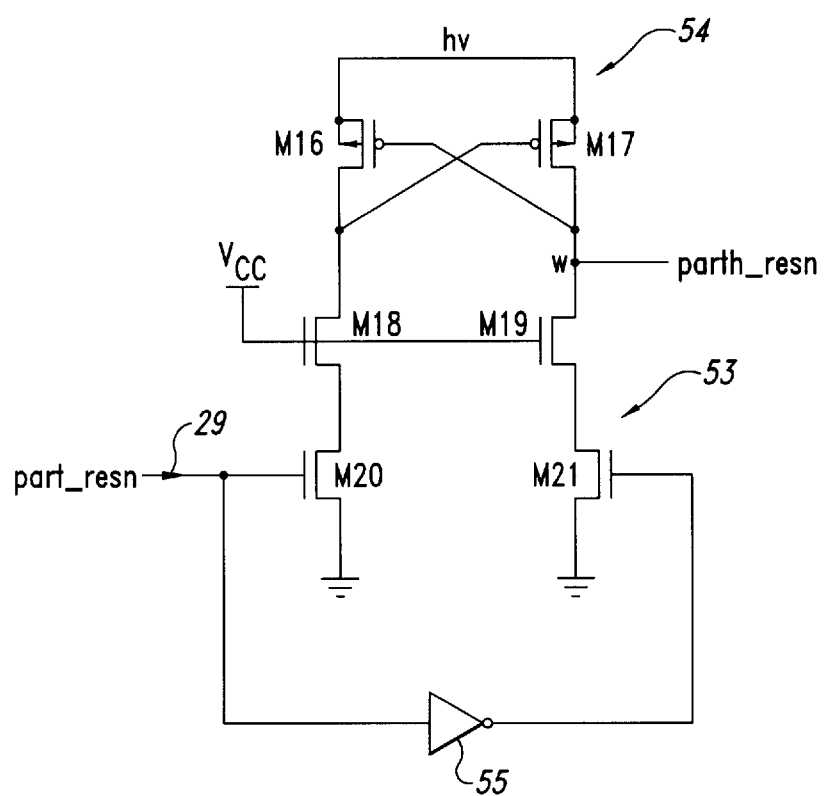
FIG. 7A shows a detail of the lower regulator block of FIG. 7.

The raised activation signal PARTH__RESN is obtained starting from the enable signal PART__RESN by means of the raising device 53 of FIG. 7A.

The raising device 53 comprises a high voltage switch 54 inserted between a high voltage reference HV and the ground reference GND. The high voltage switch 54 comprises a first M16, second M17, third M18, fourth M19, fifth M20 and sixth M21 high voltage MOS transistors. In the embodiment of FIG. 7A the first M16 and second M17 MOS transistors are P-channel while the remaining transistors M18, M19, M20 and M21 are N-channel.

The transistors M16 and M17 have their source terminals connected together and to the high voltage reference HV as well as to the respective body terminals. In addition, the control gate terminal of the transistor M16 is connected to the drain terminal of the transistor M17 and vice versa.

The drain terminals of the transistors M16 and M17 are also connected to the ground GND through the series of transistors M18 and M20 and of the transistors M19 and M21 respectively. The transistors M18 and M19 in turn have their control gate terminals connected together and to the supply voltage reference Vcc while the transistors M20 and M21 have their gate terminals connected together through a logical inverter 55.

The gate terminal of the transistor M20 is further connected to the second input terminal 29 of the lower regulator block 27 and receives the activation signal PART_RESN.

The drain terminals of the transistors M17 and M19 define a circuit node W inside the high voltage switch 54 on which is produced the raised activation signal PARTH_RESN with pattern similar to the activation signal PART_RESN applied to the input terminal 29 of the lower regulator block 27 but with a voltage level corresponding to the higher voltage HV.

The raised activation signal PARTH_RESN is also applied to another enable input of the operational amplifier 48.

Lastly, the filter 49 of the lower regulator block 27 comprises a filter capacitor CF inserted between the output terminal 36 of the lower regulator block 27 and the ground voltage reference GND, and a filter resistance 56 inserted between the output terminal 36 and the output terminal 52 of the operational amplifier 48.

The filter capacitor CF in one embodiment, is the charge capacitor CL connected to the output terminal 36 while the filter resistance is controlled on the basis of the erase verification and depleted bit condition verification phases voltage drop. In the other phases this drop is ignored and the voltage present on the output terminal of the operational amplifier 48 is equal to the desired controlled voltage.

The switching signals PROG_VER, SOFTP, DEPL_VER and ERASE_VER activate the lower regulator block 27 only when there is required one of the voltages of Table I between 4V and 7V and through the multiplexer 47 they change the gain of the operational amplifier 48.

During each operational phase of the memory there is active only one of these switching signals. For example, during the programming verification phase there is active only the switching signal PROG_VER which starts the respective transistor in the multiplexer 47 to supply a regulated voltage Vxreg on the output terminal 36 of the lower regulator block 27 of the desired value, i.e. the 7V of Table I, on the basis of the relationship:

$$V_{out} = \left(1 + \frac{R1 + R2 + R3 + R4 + R5 + R6}{R7}\right) \cdot V_{ref}$$

The compensation capacitor Cp introduces a zero near the limit frequency of 0 dB and a pole with greater frequencies.

Figure 8:
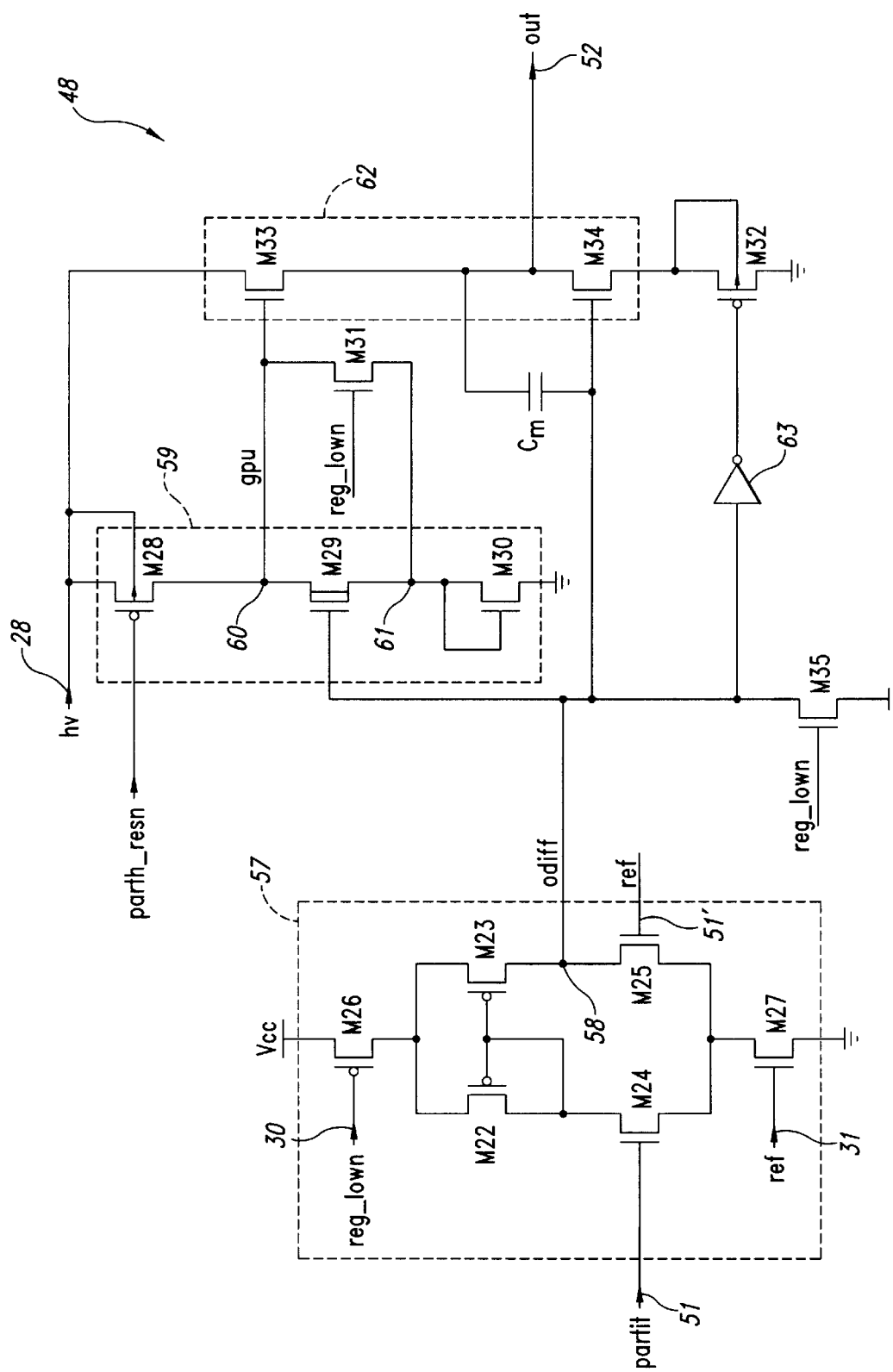
FIG. 8 shows an operational amplifier incorporated in the lower regulator block of FIG. 7.

FIG. 8 shows an operational amplifier 48 provided in accordance with the present invention.

The operational amplifier 48 comprises a differential input stage 57 inserted between the supply voltage reference Vcc and ground GND.

The differential input stage 57 comprises a first M22, second M23, third M24 and fourth M25 MOS transistors. The first M22 and second M23 transistors are configured as current mirrors while the control gate terminals of the third M24 and fourth M25 transistors are the inverting 51 and noninverting 51' input terminals of the operational amplifier 48.

In particular, in the example of FIG. 8 the first M22 and second M23 transistors of the current mirror are P-channel while the third M24 and fourth M25 input transistors are N-channel.

The noninverting input terminal 51' receives the voltage reference signal REF while the inverting input terminal 51 receives a selection signal PARTIT generated by the multiplexer 47 of the lower regulator block 27.

The source terminals of the first M22 and second M23 transistors as well as the third M24 and fourth M25 transistors are connected together and respectively to the supply voltage reference Vcc and to ground GND through a first M26 and a second M27 decoupling transistors having their control gate terminals connected respectively to the third 30 and fourth 31 input terminals of the lower regulator block 27.

In particular, the decoupling transistors M26 and M27 are respectively channel P and N.

The drain terminals of the transistors M23 and M25 define an output terminal 58 of the single-ended type of the differential input stage 57 which is in turn connected to a shifter 59 inserted between the input terminal 28 of the lower regulator block 27 and ground GND.

The shifter 59 comprises a first M28, second M29 and third M30 transistors inserted in series together between the input terminal 28 and ground GND.

In particular, in the embodiment of FIG. 8 the first transistor M28 is the high voltage P-channel MOS type while the second M29 and third M30 transistors are the N-channel MOS type.

The transistor M28 receives on its control gate terminal the raised activation signal PARTH_RESN and has its body and source terminals connected to the input terminal 28 and its drain terminal connected to the drain terminal of the transistor M29.

The drain terminals of the transistors M28 and M29 define a first output terminal 60 of the shifter 59.

The transistor M29 has its control gate terminal connected to the single-ended output terminal 58 of the differential input stage 57 while the source terminal is connected to the drain terminal of the transistor M30 to define a second output terminal 61 of the shifter 59.

The transistor M30 has its drain and control gate terminals connected together and to the output terminal 61 while the source terminal is connected to ground GND.

The output terminals 60 and 61 of the shifter 59 are connected together through a high voltage enable transistor M31 and in particular the N-channel MOS type which receives on its control gate terminal the third enable signal REG_LOWN.

The output terminal 60 is also connected to a pull-up/pull-down configuration 62 inserted between the input terminal 28 and ground GND through a high-voltage discharge enable transistor M32 and in particular the P-channel MOS type.

The pull-up/pull-down configuration 62 comprises a pull-up transistor M33 having its control gate terminal connected to the output terminal 60 of the shifter 59 in series with a pull-down transistor M34 having its source terminal connected to the discharge enable transistor M32 and its control gate and drain terminals connected together by means of a Miller compensation capacitor Cm.

The source terminal of the pull-up transistor M33 and the drain terminal of the pull-down transistor M34 define the output terminal 52 of the operational amplifier 48.

The single-ended output terminal 58 of the differential input stage 57 is also connected to ground GND through an enable transistor M35 and to the discharge enable transistor M32 through a high threshold logical inverter 63.

In particular the enable transistor M35 is the N-channel MOS type and receives on its control gate terminal the third enable signal REG_LOWN.

Generally, on the single-ended output terminal 58 of the differential input stage 57 is generated a high signal ODIFF thanks to the shifter 59, with high voltage HV and in particular 12V.

A signal GPU generated at the output 60 of the shifter 59 drives the pull-up transistor M33. Under semi-steady conditions regulation takes place by utilizing the charge current, which can be considered inserted between the output terminal 52 of the operational amplifier 48 and the ground GND.

The pull-down transistor M34 is driven directly by the signal ODIFF present at the single-ended output terminal 58 of the differential input stage 57.

The discharge enable transistor M32 is driven by the high threshold inverter 63 in such a manner as to intervene only in the transients when passing from one operational condition to another.

The operating principle underlying the present invention is to regulate the voltage Vxreg based on an appropriate timing of the enable signals.

The timing of these signals in accordance with the values of Table I is as follows.

The signal which selects the desired output of the resistive divider 50 of the lower regulator block 27 is activated.

After a period of approximately 100 ns the resistive divider 50 is enabled driving the activation signal PARTH_RESN (and hence, through the shifter 59 of the operational amplifier 48, the raised activation signal PARTH_RESN) to the reference value of ground GND.

The raised activation signal PARTH_RESN (grounded) correctly biases the inverting input terminal 51 of the operational amplifier 48 while the noninverting input terminal 51' is already at the correct voltage reference REF value.

The charge pump circuit incorporated in the generator block 15 is started by means of the enable signal PUMP-ON and the operational amplifier 48 by means of the enable signal REG_LOWN.

Figure 9:
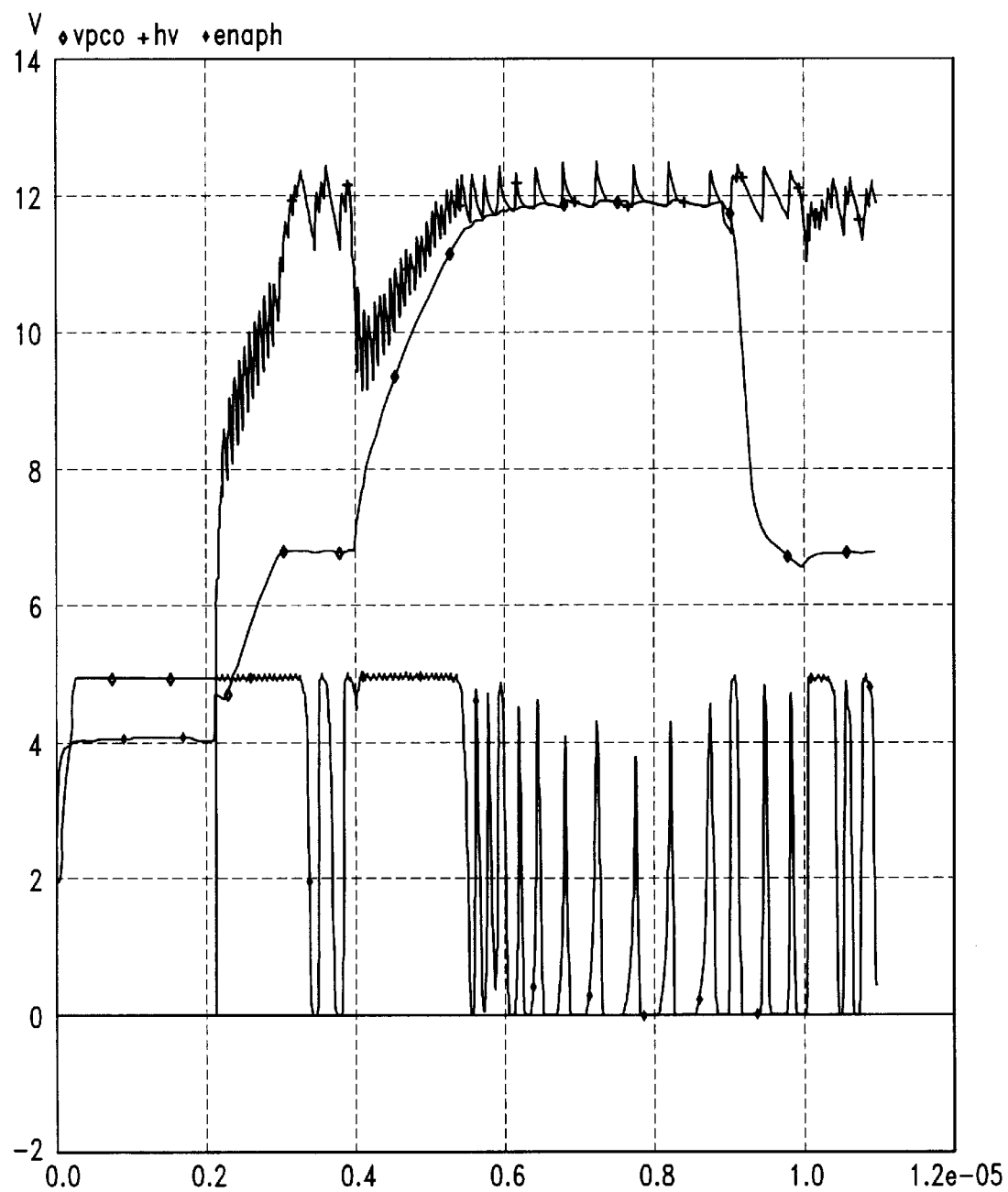
FIG. 9 shows respective characteristic curve charts of simulations performed with the device in accordance with the present invention.

FIG. 9 shows the pattern of the regulated voltage Vxreg under normal operating conditions, i.e. Vcc=5V and temperature=27° C. In particular there is shown the case of the following operational sequence.

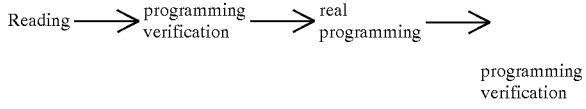

The principal advantages of the device in accordance with the present invention are the following.

Control of all the gate voltages Vg to be applied to the word line WL of the memory device MEM in the different operating conditions thereof is made through only two regulators, i.e. the upper regulator block 23 and the lower regulator block 27.

Integration of the device 14 to generate and control the gate voltage requires less silicon area.

The regulated voltage obtained through the device in accordance with the present invention is independent from the voltage reference Vcc and temperature.

The regulated voltage Vxreg outputted from the device in accordance with the present invention can be readily modified by changing the output point of the resistive divider 50 of the lower regulator block 27 merely by modifying the masks used for its integration.

Figure 10:
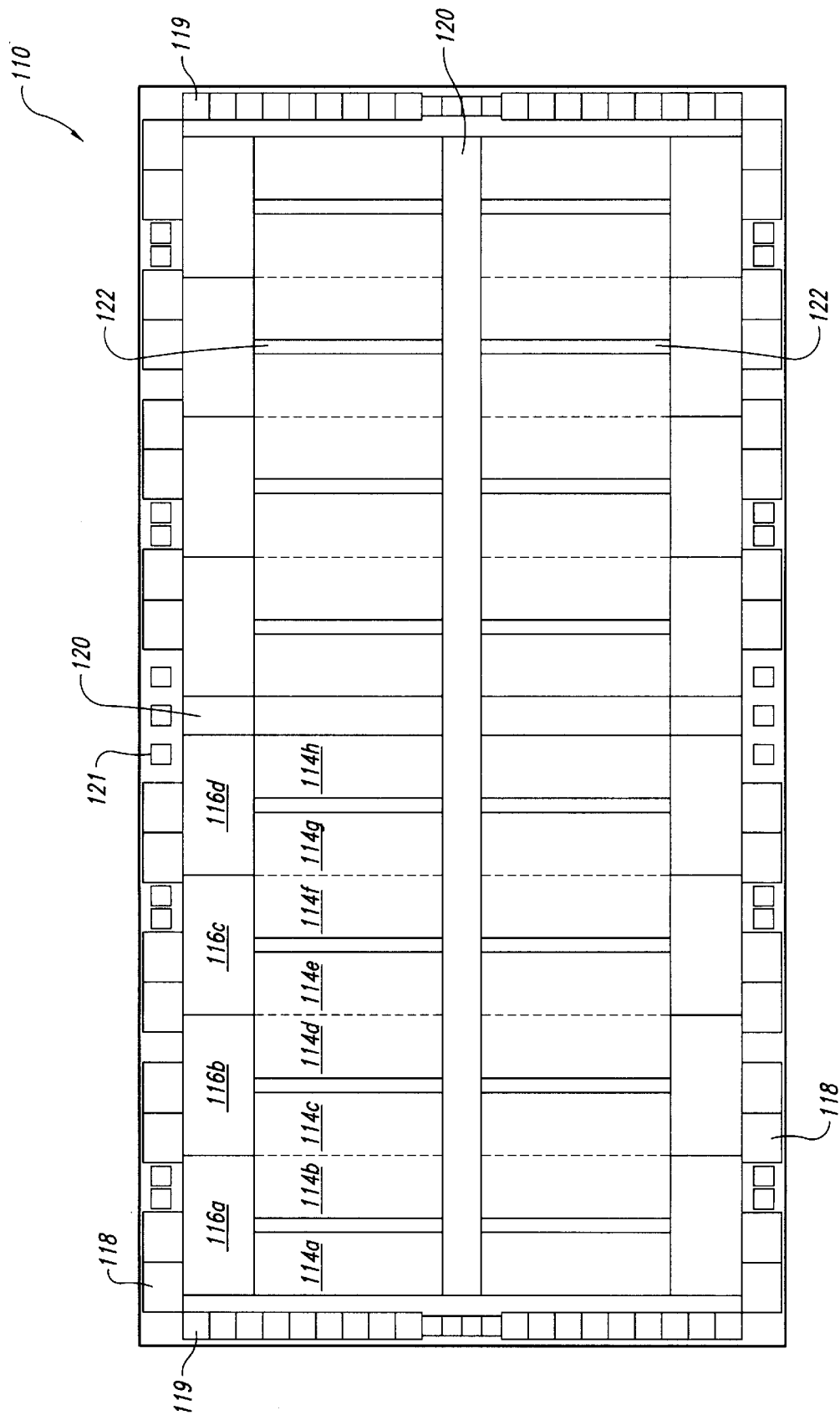
FIG. 10 illustrates an EEPROM memory according to the present invention.

As shown in FIG. 10, an integrated circuit memory device 110 includes a plurality of non-volatile memory cells arranged in sectors 114a–114h. Each sector has an array of memory cells arranged as a matrix. The non-volatile memory cells are of a type well known in the art, such as EEPROM cells, flash cells, or the like. The cells are programmable in byte mode under control of the peripheral circuitry 116 (labelled 116a–116d for selected sections). Programming in byte mode is well known in the art. A resident program algorithm is stored on the memory device at a convenient location, such as any one of sections 119, 120, or other locations. The chip is accessed by pads 118 and 121.

We claim:

1. A device for generating and regulating a gate voltage in an electrically programmable non-volatile memory comprising:

a voltage booster circuit driven by a clock signal applied to a first input terminal thereof and having an output terminal on which is produced a voltage signal higher than a power supply voltage;

a lower regulator block and a programming switching block coupled in parallel each other with their inputs connected to said output terminal of the voltage booster and their outputs connected to an output terminal of the gate voltage generating and regulating device, said lower regulator block being driven by a plurality of switching signals to supply on the output terminal of the device a plurality of regulated voltages.

2. The device in accordance with claim 1 wherein said lower regulator block comprises:

a multiplexer inserted between a ground voltage reference and an output terminal of the lower regulator block by means of the series of an operational amplifier in noninverting configuration and a filter with said multiplexer having a plurality of switching terminals which receive said plurality of switching signals.

3. The device in accordance with claim 1 wherein said programming switching block comprises:

a high voltage switch and an enable circuit inserted in series each other between an input terminal and the output terminal of the programming switching block; and a slope resistance inserted between said input terminal and the enable circuit.

4. The device in accordance with claim 1, further including:

an upper regulator block having a first input terminal connected to the output terminal of the voltage booster circuit; and an output terminal connected to a second input terminal of said voltage booster circuit, said additional upper regulator block supplying at output a regulation signal for the voltage booster.

5. The device in accordance with claim 4 wherein said additional upper regulator block comprises:

a voltage divider positioned between the first input terminal and the ground voltage reference and connected to the output terminal through a comparator which is positioned between the supply voltage reference and the ground voltage reference.

6. The device in accordance with claim 2 wherein said multiplexer comprises a plurality of MOS transistors having their source terminals connected to the ground voltage reference through a resistive divider, their drain terminals connected together and to an inverting input terminal of the operational amplifier and their control gate terminals corresponding to the plurality of switching terminals.

7. The device in accordance with claim 6 wherein said resistive divider is also connected to an output terminal of the operational amplifier by means of a high voltage MOS enable transistor and to the inverting input terminal of the operational amplifier by means of a compensation capacitor.

8. The device in accordance with claim 2 wherein said operational amplifier comprises a differential input stage inserted between the ground voltage reference and the supply voltage and having an inverting input terminal connected to the multiplexer, a noninverting input terminal to which is applied a voltage reference signal, and an output terminal connected to a shifter inserted between the output terminal of the voltage booster and the ground voltage reference.

9. The device in accordance with claim 2 wherein said filter comprises a filter resistance inserted between said output terminal of the lower regulator block and the output terminal of the operational amplifier.

* * * * *